US011333806B2

(12) United States Patent
Goldmann et al.

(10) Patent No.: US 11,333,806 B2
(45) Date of Patent: May 17, 2022

(54) RELIABLE LIGHT CONVERSION DEVICE FOR LASER-BASED LIGHT SOURCES

(71) Applicant: Lumileds LLC, San Jose, CA (US)

(72) Inventors: Claudia Goldmann, Aachen (DE); Hans-Helmut Bechtel, Aachen (DE); Matthias Heidemann, Aachen (DE); Rainald Gierth, Cologne (DE); Thomas Diederich, Aachen (DE)

(73) Assignee: Lumileds LLC, San Jose, CA (US)

( * ) Notice: Subject to any disclaimer, the term of this patent is extended or adjusted under 35 U.S.C. 154(b) by 217 days.

(21) Appl. No.: 16/606,657

(22) PCT Filed: Apr. 19, 2018

(86) PCT No.: PCT/EP2018/059990
§ 371 (c)(1),
(2) Date: Oct. 18, 2019

(87) PCT Pub. No.: WO2018/193016
PCT Pub. Date: Oct. 25, 2018

(65) Prior Publication Data
US 2021/0302003 A1    Sep. 30, 2021

(30) Foreign Application Priority Data

Apr. 21, 2017 (EP) .................................... 17167577

(51) Int. Cl.
*G02B 5/00* (2006.01)
*G02B 5/08* (2006.01)
(Continued)

(52) U.S. Cl.
CPC ............ *G02B 5/0825* (2013.01); *F21S 41/16* (2018.01); *F21S 41/176* (2018.01); *F21S 41/30* (2018.01);
(Continued)

(58) Field of Classification Search
CPC .......... F21S 45/47; F21S 41/30; F21S 41/176; F21S 41/16; F21V 29/505; F21V 29/70; F21V 9/30; F21V 7/22; G02B 5/0825
See application file for complete search history.

(56) References Cited

U.S. PATENT DOCUMENTS 9,810,930 B2    11/2017    Merrill et al.
9,909,750 B2     6/2018    Kawamata et al.
(Continued)

FOREIGN PATENT DOCUMENTS

CN    103038681 A     4/2013
CN    103367611 A    10/2013
(Continued)

OTHER PUBLICATIONS

EPO as ISA, PCT/EP2018/059990 filed Apr. 19, 2018, "International Search Report and Written Opinion", dated Jul. 5, 2018, 14 pages.
(Continued)

*Primary Examiner* — Gerald J Sufleta, II

(57) ABSTRACT

The invention describes a light conversion device having a light converter, which is adapted to convert primary light to converted light, so that a peak emission wavelength of the converted light is in a longer wavelength range than a peak emission wavelength of the primary light. The light conversion device also has a reflective structure coupled to at least a part of a coupling surface of the light converter, where the reflective structure is a narrowband reflector arranged to reflect at least some of the primary light impinging on the reflective structure and to transmit at least some of the converted light impinging on the reflective structure.

18 Claims, 2 Drawing Sheets

(51) Int. Cl.

| | | |
|---|---|---|
| *H01S 5/00* | (2006.01) | |
| *F21V 29/505* | (2015.01) | |
| *F21V 29/70* | (2015.01) | |
| *F21S 41/30* | (2018.01) | |
| *F21S 41/176* | (2018.01) | |
| *F21S 41/16* | (2018.01) | |
| *F21S 45/47* | (2018.01) | |
| *F21V 9/30* | (2018.01) | |
| *F21V 7/22* | (2018.01) | |

(52) U.S. Cl.
CPC ............... *F21S 45/47* (2018.01); *F21V 7/22* (2013.01); *F21V 9/30* (2018.02); *F21V 29/505* (2015.01); *F21V 29/70* (2015.01); *H01S 5/0087* (2021.01)

(56) References Cited

U.S. PATENT DOCUMENTS

| | | | |
|---|---|---|---|
| 10,109,774 B2 | 10/2018 | Mazuir et al. | |
| 10,753,577 B2* | 8/2020 | Van Bommel | G02B 19/0023 |
| 2011/0006334 A1* | 1/2011 | Ishii | C09K 11/7734 |
| | | | 257/98 |
| 2012/0230007 A1* | 9/2012 | Kawakami | F21S 41/176 |
| | | | 362/19 |
| 2013/0270587 A1* | 10/2013 | Ouderkirk | G02B 27/141 |
| | | | 257/89 |
| 2014/0117396 A1* | 5/2014 | Eisert | H01L 33/505 |
| | | | 257/98 |
| 2014/0233210 A1 | 8/2014 | Owada | |
| 2015/0023023 A1* | 1/2015 | Livesay | H01L 33/50 |
| | | | 362/294 |
| 2015/0159836 A1 | 6/2015 | Tamaki et al. | |
| 2016/0138766 A1* | 5/2016 | Owada | F21K 9/64 |
| | | | 362/84 |
| 2016/0290856 A1* | 10/2016 | Fiederling | F21S 41/176 |
| 2016/0334552 A1* | 11/2016 | Lenef | G02B 5/0858 |
| 2018/0238520 A1* | 8/2018 | Sorg | F21V 29/70 |
| 2019/0093871 A1* | 3/2019 | Sato | C09K 11/7706 |
| 2019/0179218 A1* | 6/2019 | Jagt | F21S 41/285 |

FOREIGN PATENT DOCUMENTS

| | | |
|---|---|---|
| CN | 104379987 A | 2/2015 |
| CN | 105453282 A | 3/2016 |
| CN | 105762239 A | 7/2016 |
| CN | 105841097 A | 8/2016 |
| CN | 106195922 A | 12/2016 |
| JP | 2014186882 A | 10/2014 |
| JP | 2017016792 A | 1/2017 |
| WO | 2015/112946 A1 | 7/2015 |

OTHER PUBLICATIONS

European Extended Search Report dated Nov. 30, 2017, European Patent Application No. 17167577.0, 8 pages.

* cited by examiner

RELIABLE LIGHT CONVERSION DEVICE FOR LASER-BASED LIGHT SOURCES

CROSS-REFERENCE TO RELATED APPLICATIONS

The present application is a § 371 application of International Application No. PCT/EP/2018/059990 filed on Apr. 19, 2018 and titled "RELIABLE LIGHT CONVERSION DEVICE FOR LASER-BASED LIGHT SOURCES," which claims the benefit of European Application No. 17167577.0 filed on Apr. 21, 2017. International Application No. PCT/EP2018/059990 and European Patent Application No. 17167577.0 are incorporated herein.

FIELD OF THE INVENTION

The invention relates to a light conversion device and a laser-based light source comprising the light conversion device. The invention further relates to a vehicle headlight comprising the laser-based light source.

BACKGROUND OF THE INVENTION

Reliability of light converters for e.g. white laser-based light sources like, for example, automotive headlights strongly depend on an effective cooling of the light converters. It is therefore necessary to enable a reliable and effective thermal coupling between the light converter (e.g. phosphor) and a heat dissipating structure (heatsink). Furthermore, optical losses increasing the temperature of the converter and thus decreasing the efficiency of the light converter should be avoided.

SUMMARY OF THE INVENTION

It is an object of the present invention to provide a light conversion device enabling a reliable thermal and optical coupling between a light converter and a heatsink. The invention is described in the independent claims. The dependent claims comprise preferred embodiments.

According to a first aspect a light conversion device is provided. The light conversion device comprises a light converter. The light converter is adapted to convert primary light to converted light. A peak emission wavelength of the converted light is in a longer wavelength range than a peak emission wavelength of the primary light. The light conversion device further comprises a reflective structure coupled to at least a part of a coupling surface of the light converter. The reflective structure is a narrowband reflector which is arranged to reflect at least 55%, more preferably at least 70% and most preferably at least 90% of the primary light impinging on the reflective structure.

Laser applications e.g. for automotive headlamps are typically based on blue laser light (an example of primary light) that is partly converted to yellow light (an example of converted light) using a light converter like a phosphor in order to achieve the desired overall white light color. In these cases, typically, a laser beam with an energy of 1W or more hits a relatively small phosphor area (<<1 mm$^2$) that is bonded onto a heatsink. The heatsink comprises in the reflective approach (e.g. the blue light is entering the light converter/heatsink junction from one side and the white light is collected on the same side) a mirror structure like a reflective layer comprising, for example, a silver layer in order to avoid losses of converted light (e.g. yellow) and primary light (e.g. blue).

One major challenge is to make a light converter/heatsink junction that can effectively dissipate the heat created during conversion of the blue light (Stokes losses, absorption losses in phosphor package etc.) and thus prevent catastrophic failure of the entire light converter due to overheating. An especially heat sensitive part of the junction is the interface between the light converter and the heatsink, which can e.g. be a thin glue layer that may be less robust against high temperature and irradiation by blue laser light than the other components of the laser package.

Silicone glues may, for example, be used in such glued junctions. By a suitable optimization of the material's molecular structure the temperature stability of the silicones can be increased to temperatures near the point where the phosphor starts to quench thermally (~150-200° C.). However, experiments have shown that despite of the temperature stability of the silicones optical degradation over time and thus premature degradation of the phosphor package cannot be avoided (making it useless for further application). Preliminary experimental results suggest that the intensive blue light most likely in combination with the relative high temperature of e.g. more than 100° C. triggers degradation of the optical performance of the mirror or the glue. One potential explanation is that, for example, silver atoms or ions from a silver mirror diffuse into the glue layer. The silver atoms or ions seem to react with the material of the glue layer or gas in the surrounding due to the intense blue light causing the optical degradation. The silver mirror seems thus to be sensitive with respect to the intense blue light.

The light conversion device in combination with the narrowband reflective structure prevents that blue or, in general, primary light above a threshold intensity reaches the mirror structure and, depending on the narrowband reflector's position, also the glue layer. The reflectivity of the reflective structure at the coupling surface of the light converter which is needed to inhibit the diffusion process (provided that this analysis of the experimental results is correct) depends on the initial intensity of the laser light, the thickness, doping and scattering properties of the light converter as well as the angle of incidence between the beam of primary light and the light converter (effective thickness of the light converter with respect to the beam). Preliminary experiments show that the intensity of the primary light impinging on the mirror structure of the heatsink, especially in the case of blue primary light, has to be less than 1 W/mm$^2$, more preferably less than 0.1 W/mm$^2$, and most preferably less than 0.01 W/mm$^2$. The reflectivity of the narrowband reflective structure has to be arranged in accordance with the factors (initial intensity, thickness, doping etc.) mentioned above in order to reduce the intensity accordingly.

It cannot be excluded based on the experimental results that other mechanisms and especially other reaction mechanisms in the glue layer, which are triggered or caused by the intense blue light, are responsible for the degradation of the optical performance. But the experimental results of the inventors clearly prove that the narrowband reflector delays or even inhibits degradation of the optical performance.

The primary light may, for example, be laser light with a laser peak emission wavelength of 450 nm.

The reflective structure is a narrowband reflector meaning that mainly only the primary light is (partially) reflected while the converted light is (mostly) transmitted. This means that at least 50%, preferably at least 70%, and more preferably at least 90% of the converted light impinging on the reflective structure is transmitted through the reflective structure.

Preferably, the light converter is made of a densely sintered ceramic body. E.g. $(Lu,Y,Gd,Ce)_3(Al,Ga)_5O_{12}$. Absorption and emission of blue light is taking place at Cerium (III) ions. The concentration of Ce is 0.1 to 0.5 atom percent.

The thickness of the ceramic light converter might be between 40 μm and 150 μm.

In a preferred embodiment, the ceramic light converter is sintered from mixed oxide starting materials, with an excess of $Al_2O_3$, sintering to a poly-crystalline ceramic light converter. The crystalline size is between 3 μm and 30 μm in diameter. In a preferred embodiment, the ceramic light converter consists of a random mixture of Garnet crystallites and $Al_2O_3$ crystallites, where the volume fraction of the $Al_2O_3$ crystallites ranges from 1 volume percent to 80 volume percent of the ceramic body. After sintering, the ceramic light converter plate is grinded from both sides, for yielding a surface roughness of Ra<300 nm, more preferred Ra<150 nm, and most preferred Ra<30 nm. The ceramic light converter is sintered "pore-dense" and may be coated at least on one surface with a dichroic coating of alternating high and low index of refraction materials. The dichroic layers are constructed at one side to decrease the reflection of the incident primary light, yielding an anti-reflection coating for the incident primary light, while, on the other side of the light converter, the dichroic layers serve to increase the reflection of primary light, yielding the inventive narrowband reflector on the light converter's coupling surface.

The light converter may be mechanically coupled by means of a coupling layer to a heatsink. The heatsink comprises a mirror structure as described above. The mirror structure is arranged to reflect at least 90%, preferably at least 95% and most preferably at least 98% of the converted light impinging on the mirror structure back to the light converter. The narrowband reflective structure is arranged between the coupling surface of the light converter and the mirror structure in order to reduce the intensity of primary light impinging on the mirror structure as described above.

The coupling layer may, for example, be a layer of silicone glue or other glues or adhesives with high temperature and optical stability as described above.

The narrowband reflective structure may, according to a first embodiment, comprise at least one layer deposited on the coupling surface such that the coupling layer is arranged between the narrowband reflective structure and the mirror structure. Arranging the narrowband reflective structure such that the intensity of primary light impinging on the coupling layer is reduced may have the additional effect that other aging mechanisms of the coupling layer being triggered or at least enhanced by the primary light may be inhibited.

The narrowband reflective structure may, according to a another embodiment, comprise at least one layer deposited on top of the mirror structure such that the coupling layer is arranged between the narrowband reflective structure and the light converter. Arranging the narrowband reflective structure such that a direct contact between the mirror structure and the coupling layer is avoided may have the effect that the narrowband reflective structure inhibits or at least impedes the diffusion, i.e., provides a diffusion barrier, between the mirror structure and the coupling layer. In such embodiment, then, generation and/or diffusion of particles (especially silver ions) comprised by the mirror structure are delayed or even inhibited. It may even be sufficient to provide only a diffusion barrier between the coupling layer and the mirror structure without the reflective properties for the primary light. The diffusion barrier may then be essentially transparent also in the wavelength range of the primary light. The diffusion barrier may delay or even inhibit diffusion of particles comprised by the mirror structure as described above. The narrowband reflective structure and/or the diffusion barrier function in this case as a protective layer arranged to delay degradation of the light conversion device and especially of the coupling layer.

The coupling surface may be arranged opposite to a light emission surface of the light converter. The primary light may in this case pass the light emission surface before entering the light converter.

The narrowband reflective structure may comprise a dielectric mirror. A dielectric mirror comprises a multitude of layers with different refractive indices. The reflectivity may be tailored by means of the number of layers, the thickness of the layers and the refractive indices of the layers in order to provide the required reflectivity which depends on the primary light, the material of the light converter and its optical properties or the geometric arrangement between the impinging primary light (e.g. angle of incidence) with respect to the light converter. The multilayer structure of the dielectric mirror may also provide an improved diffusion barrier. Such a diffusion barrier may be especially helpful if the mirror structure comprises a silver layer or other reflective metal layer deposited on the side of the heatsink next to the light converter.

According to a second aspect of the invention a laser-based light source is provided. The laser-based light source comprises:
 at least one laser, wherein the at least one laser is adapted to emit laser light, and
 a light conversion device according to any of the embodiments described above.

The laser-based light source may also comprise two, three, four or more lasers (e.g. in the form of an array) emitting for example blue laser light. The laser may preferably be a semiconductor laser emitting blue laser light.

According to a further aspect a vehicle headlight is provided. The vehicle headlight comprises at least one laser-based light source as described above. The vehicle headlight may comprise two, three, four or more laser-based light sources as described above.

The white point of a vehicle headlight like an automotive headlight used for forward lighting is preferably characterized by a correlated color temperature (CCT) of 5700 K, or a v' coordinate of about 0.48. White light areas are defined in standards. E.g. ANSI C78.377 is a standard for chromaticity specified by the American National Standards Institute. Most automotive headlights use the 5700 K range as described above. Alternatively, it may also be possible to use a color temperature of 6000 K. The vehicle headlight comprising a laser-based light source as described above may support to provide high-quality white light.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a first embodiment of a laser-based light source comprising a first light conversion device.

FIG. 2 shows a principal sketch of a second embodiment of a laser-based light source comprising a second light conversion device.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
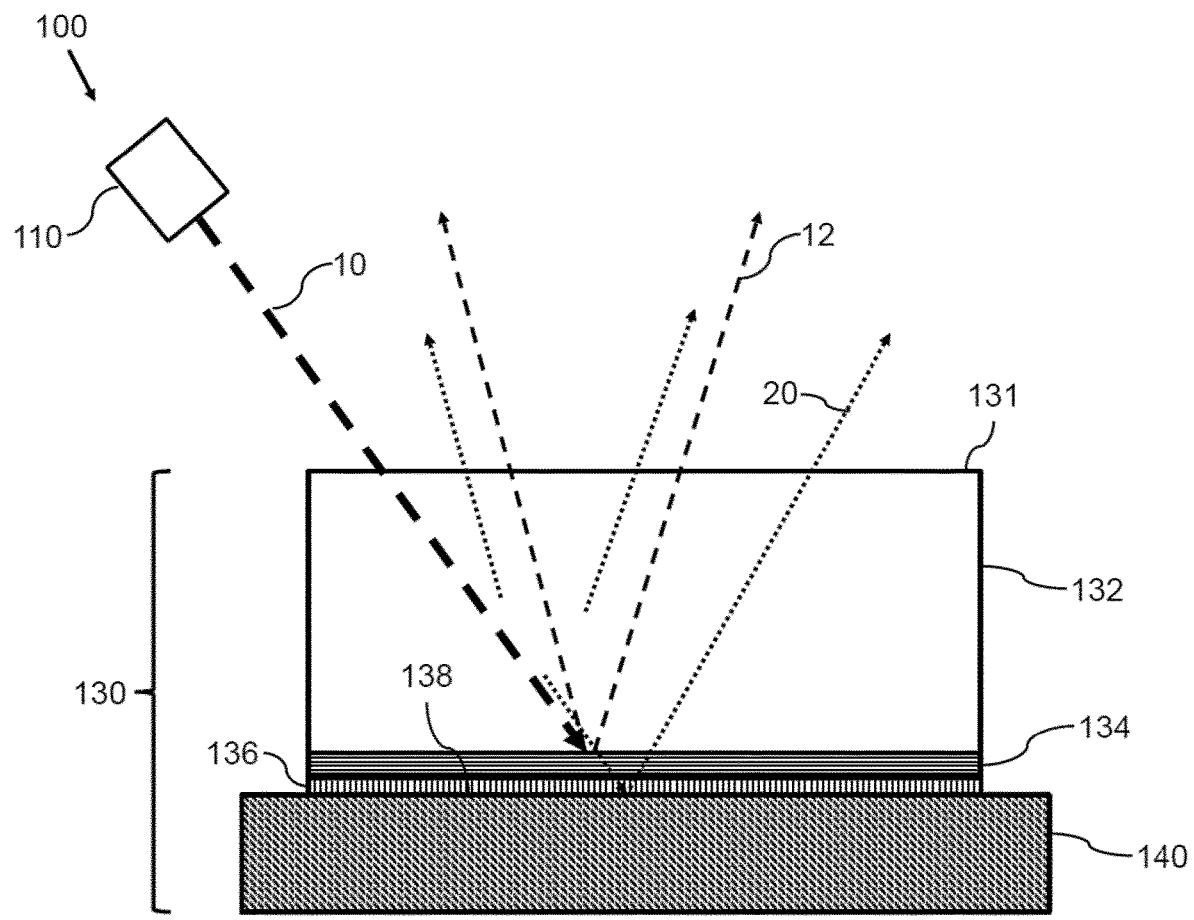

FIG. 1 shows a principal sketch of a first embodiment of a laser-based light source 100 which comprises a laser 110 and a first light conversion device 130. The first light conversion device 130 comprises a light converter 132 with a light emission surface 131 and a narrowband reflective structure 134 attached to a coupling surface of the light converter 132 (back surface of the light converter 132 opposite to the light emission surface 131 in this case). The light converter 132 is mechanically coupled (glued) by means of a coupling layer 136 to a heatsink 140 such that the coupling layer 136 is arranged between the narrowband reflective structure 134 and the heatsink 140. At least part of the surface of the heatsink 140 is reflective, preferably highly reflective at least in the wavelength range of the converted light 20. The laser 110 emits primary light 10 (e.g. blue laser light) to the light conversion device 130. The blue laser light enters the light converter 132 via the light emission surface 131. A part of the blue laser light is converted to yellow converted light 20 by means of the light converting material of the light converter 132. A part of the converted light 20 impinges on the mirror structure 138 comprised by the heatsink 140 after traversing the narrowband reflective structure 134 and the coupling layer 136. Essentially all of the converted light 20 impinging on the mirror structure 138 is reflected back to the light converter 132. The coupling layer 136 should therefore be transparent at least in the wavelength range of the converted light 20. Primary light 10 that is not converted within the light converter 132 may impinge on the narrowband reflective structure 134. The narrowband reflective structure 134 comprises in this case a layer which reflects 98-99% of the primary light 10 impinging on the narrowband reflective structure 134 such that reflected primary light 12 is emitted via the light emission surface 131 together with converted light 20.

The narrowband reflective structure 134 is essentially transparent within the wavelength range of the converted light 20. The narrowband reflective structure 134 reduces the intensity of the blue primary light 10 behind the narrowband reflective structure 134 such that degradation of the coupling layer 136 is inhibited or at least delayed. The light converting device 130 is arranged to emit 26% blue laser light and 74% yellow converted light via the light emission surface 131 such that essentially white light is emitted by the light emission surface 131.

Figure 2:
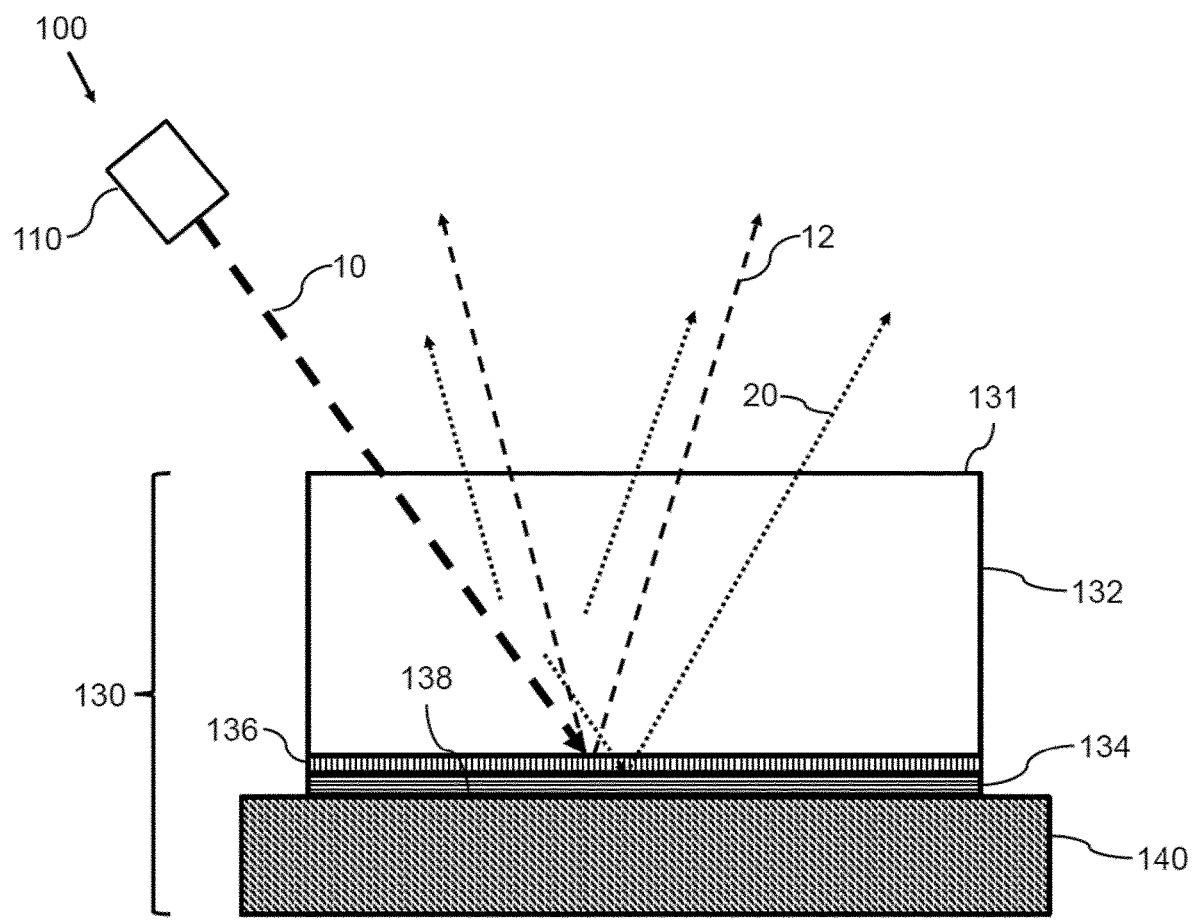

FIG. 2 shows a principal sketch of a second embodiment of the laser-based light source 100 comprising a laser 110 and a second light conversion device 130. The general configuration is very similar to the embodiment discussed with respect to FIG. 1. The light conversion device 130 also comprises a heatsink 140 coupled to a coupling surface of the light converter 132. The heatsink 140 comprises a mirror structure 138 which is a silver layer deposited on the heatsink. But, in difference to FIG. 1, here the heatsink 140 comprises the narrowband reflective structure 134.

The narrowband reflective structure 134 comprises a stack of thin layers with high and low refractive index in an alternating order being deposited on top of the silver layer, yielding a dielectric mirror with a reflectivity of 97% in the wavelength range of the primary light within a range of angles of incidence of +/−60° with respect to a normal to the surface of the narrowband reflective structure. The narrowband reflective structure 134 may be essentially transparent in the wavelength range of the converted light 20.

The light converter 132 is a yellow phosphor garnet (YAG:Ce) which is bonded by means of a coupling layer 136 on top of the narrowband reflective structure 134 such that the coupling layer 136 is arranged between the light converter 132 and the narrowband reflective structure 134. The coupling layer 136 is in this case transparent in the wavelength range of the primary light 10 and in the wavelength range of the converted light 20. The dielectric mirror 134 deposited on top of the silver layer 138 most likely also inhibits diffusion of silver atoms or ions to the coupling layer 136, the silver atoms may be having been ionized by means of the primary light. The converted light 20 is nearly to 100% reflected by the silver layer 138 but is nearly completely transmitted by the narrowband reflective structure 134.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 10 primary light
12 reflected primary light
20 converted light
100 laser-based light source
110 laser
130 light conversion device
131 light emission surface
132 light converter
134 narrowband reflective structure
136 coupling layer
138 mirror structure
140 heatsink

The invention claimed is:

1. A light conversion device comprising:
a light converter having a light emission surface and a coupling surface opposite the light emission surface, the light converter adapted to convert primary light to converted light, a peak emission wavelength of the converted light being in a longer wavelength range than a peak emission wavelength of the primary light,
a reflective structure coupled to at least a part of the coupling surface of the light converter, the reflective structure being a narrowband reflector arranged to reflect at least 55% of the primary light impinging on the reflective structure for transmission out of the light conversion device through the light emission surface of the light converter and to transmit at least 50% of the converted light impinging on the reflective structure.

2. The light conversion device according to claim 1, wherein the light converter is mechanically coupled by a coupling layer to a heatsink comprising a mirror structure, wherein the mirror structure is arranged to reflect at least 90% of the converted light impinging on the mirror structure back to the light converter, and wherein the reflective structure is arranged between the coupling surface of the light converter and the mirror structure.

3. The light conversion device according to claim 2, wherein the reflective structure comprises at least one layer deposited on the coupling surface such that the coupling layer is arranged between the reflective structure and the mirror structure.

4. The light conversion device according to claim 2, wherein the reflective structure comprises at least one layer deposited on top of the mirror structure such that the coupling layer is arranged between the reflective structure and the light converter.

5. The light conversion device according to claim 1, wherein the coupling surface is arranged opposite to the light emission surface of the light converter.

6. The light conversion device according to claim 1, wherein the reflective structure comprises a dielectric mirror.

7. The light conversion device according to claim 2, wherein the mirror structure comprises a silver layer deposited on a side of the heatsink next to the light converter.

8. A laser-based light source comprising:
at least one laser, wherein the at least one laser is adapted to emit the primary light, and
a light conversion device according to claim 1.

9. A vehicle headlight comprising a laser-based light source according to claim 8.

10. The laser-based light source according to claim 8, wherein the light converter is between the at least one laser and the reflective structure.

11. The light conversion device according to claim 1, further comprising a heatsink comprising a mirror structure arranged to reflect at least some of the converted light impinging on the mirror structure back to the light converter, the reflective structure being between the light converter and the heatsink.

12. The light conversion device according to claim 11, wherein the reflective structure is coupled by a coupling layer to the heatsink.

13. The light conversion device according to claim 12, wherein the coupling layer is an adhesive layer.

14. The light conversion device according to claim 13, wherein the adhesive layer is a glue layer.

15. The light conversion device according to claim 12, wherein the reflective structure is between the coupling layer and the heatsink.

16. The light conversion device according to claim 12, wherein the coupling layer is between the reflective structure and the heatsink.

17. The light conversion device according to claim 1, wherein the reflective structure is in direct contact with the coupling layer, and at least one of the reflective structure and the coupling layer is in direct contact with the light converter.

18. The light conversion device according to claim 17, further comprising a silver layer in direct contact with the reflective structure, wherein the coupling layer is in direct contact with the light converter.

* * * * *